US012772845B2

(12) United States Patent
Uramoto et al.

(10) Patent No.: US 12,772,845 B2
(45) Date of Patent: Oct. 20, 2026

(54) SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Koji Uramoto, Nisshin (JP); Masayuki Kamiya, Nisshin (JP); Masaki Aoshima, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 221 days.

(21) Appl. No.: 18/633,891

(22) Filed: Apr. 12, 2024

(65) Prior Publication Data

US 2024/0413044 A1 Dec. 12, 2024

(30) Foreign Application Priority Data

Jun. 8, 2023 (JP) ................................ 2023-094864

(51) Int. Cl.
*H01L 23/00* (2006.01)
*H10W 40/25* (2026.01)

(52) U.S. Cl.
CPC ....... *H10W 40/257* (2026.01); *H10W 40/255* (2026.01)

(58) Field of Classification Search
CPC . H10W 40/256; H10W 40/255; H10W 40/10; H10W 40/257; H10W 90/734; H10W 72/352; H10W 90/724; H10W 72/073; H10W 40/73; H10W 90/401; H10W 70/02; H10W 90/288; H10W 70/664; H10W 70/611; H10W 72/267; H10W 72/07236; H10W 90/722; H10W 90/811; H10W 90/756; H10W 90/732;
(Continued)

(56) References Cited

FOREIGN PATENT DOCUMENTS

CN 111480228 A * 7/2020 ............ H10W 40/25
JP 2006196593 A 7/2006
(Continued)

*Primary Examiner* — Niki H Nguyen
(74) *Attorney, Agent, or Firm* — Posz Law Group, PLC

(57) ABSTRACT

A semiconductor device includes a semiconductor element, an anisotropic graphite, a first bonding layer, an insulating member, a metal plate, a second bonding layer, and a third bonding layer. The semiconductor element has a chip shape. The anisotropic graphite has one surface to which the semiconductor element is disposed. A direction along the one surface is a c-axis direction of the anisotropic graphite. The first bonding layer bonds the semiconductor element to the one surface of the anisotropic graphite. The insulating member has a plate shape, is disposed across the anisotropic graphite from the semiconductor element, and insulates the anisotropic graphite. The metal plate is made of a metal material, has a plate shape, and is disposed between the anisotropic graphite and the insulating member. The second bonding layer bonds the anisotropic graphite and the metal plate. The third bonding layer bonds the metal plate and the insulating member.

7 Claims, 7 Drawing Sheets

(58) Field of Classification Search
CPC ............. H10W 72/013; H10W 72/072; H10W 72/646; H10W 90/766; H10W 72/923; H10W 72/856; H10W 74/117; H10W 90/26; H10W 20/4462; H10W 72/951; H10W 90/726; H10W 90/767; H10W 40/242; H10W 72/536; H10W 90/752; H10W 90/24; H10W 90/755; H10W 40/40; H10W 72/07152; H10W 76/60; H10W 80/211; H10W 74/129; H10W 72/942; H10W 72/9223; H10W 72/5434
See application file for complete search history.

(56) References Cited

FOREIGN PATENT DOCUMENTS

| | | | |
|---|---|---|---|
| JP | 2007-044994 | A | 2/2007 |
| JP | 2021100006 | A | 7/2021 |
| JP | 2021-150358 | A | 9/2021 |

* cited by examiner

SEMICONDUCTOR DEVICE

CROSS REFERENCE TO RELATED APPLICATION

The present application claims the benefit of priority from Japanese Patent Application No. 2023-094864 filed on Jun. 8, 2023. The entire disclosure of the above application is incorporated herein by reference.

TECHNICAL FIELD

The present disclosure relates to a semiconductor device.

BACKGROUND

Conventionally, there has been known a semiconductor device in which a semiconductor element is mounted to an anisotropic graphite to dissipate heat.

SUMMARY

The present disclosure provides a semiconductor device including a semiconductor element, an anisotropic graphite, a first bonding layer, an insulating member, a metal plate, a second bonding layer, and a third bonding layer. The semiconductor element has a chip shape. The anisotropic graphite has one surface to which the semiconductor element is disposed. A direction along the one surface is a c-axis direction of the anisotropic graphite. The first bonding layer bonds the semiconductor element to the one surface of the anisotropic graphite. The insulating member has a plate shape, is disposed across the anisotropic graphite from the semiconductor element, and insulates the anisotropic graphite. The metal plate is made of a metal material, has a plate shape, and is disposed between the anisotropic graphite and the insulating member. The second bonding layer bonds the anisotropic graphite and the metal plate. The third bonding layer bonds the metal plate and the insulating member.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
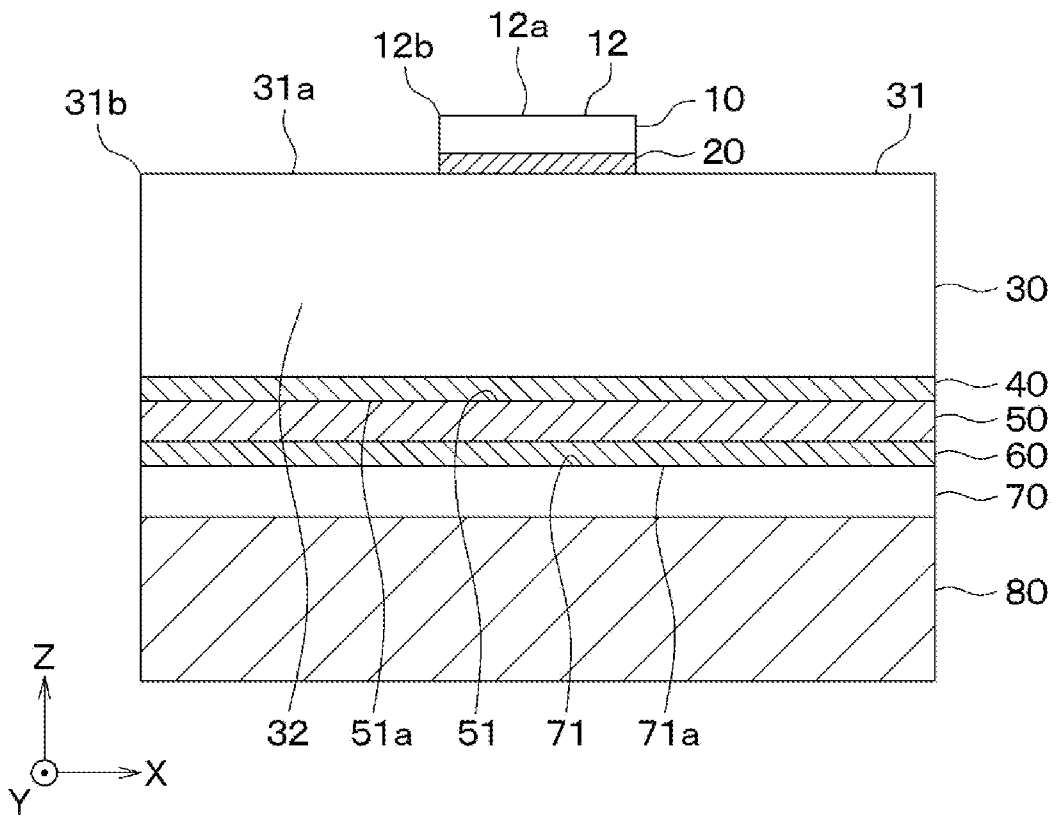
FIG. 1 is a cross-sectional view of a semiconductor device according to a first embodiment.

Next, a relevant technology is described only for understanding the following embodiments. A semiconductor package according to the relevant technology includes a semiconductor element and an anisotropic graphite composite to which the semiconductor element is mounted. The anisotropic graphite composite is composed of an anisotropic graphite having a rectangular plate shape, a thin metal layer for bonding, and an inorganic material layer having an insulation property. The semiconductor element is bonded onto the anisotropic graphite, the inorganic material layer is disposed across the anisotropic graphite from the semiconductor element to ensure insulation, and a cooler is attached to the inorganic material layer to form the semiconductor package. The anisotropic graphite and the inorganic material layer are joined by the thin metal layer of about 8 μm to 50 μm made of plating or a metal brazing material.

In the above-described structure, a direction along one side of a surface of the anisotropic graphite and a direction along another side perpendicular to the one side are defined as an X-axis and a Y-axis, respectively, and a thickness direction of the anisotropic graphite perpendicular to the X-axis and the Y-axis is defined as a Z-axis. A crystal orientation of the anisotropic graphite is in the Z-axis direction. The semiconductor element having a rectangular chip shape is disposed to a surface of the anisotropic graphite with one side of the semiconductor element facing the X-axis direction and another side perpendicular to the one side facing the Y-axis direction so that a heat dissipation capability is improved.

In the above-described semiconductor package, the crystal orientation of the anisotropic graphite is oriented in the Z-axis direction, and while heat conduction in the X-axis and Z-axis directions is good, heat conduction in the Y-axis direction is poor. In addition, a structure in which the anisotropic graphite and the inorganic material layer are simply bonded via the thin metal layer has a low effect of transferring heat in the Y-axis direction in the anisotropic graphite, and it is difficult to dissipate heat generated by the semiconductor element. Therefore, it is difficult to lower a thermal resistance of the semiconductor package.

A semiconductor device according to an aspect of the present disclosure includes a semiconductor element, an anisotropic graphite, a first bonding layer, an insulating member, a metal plate, a second bonding layer, and a third bonding layer. The semiconductor element has a chip shape. The anisotropic graphite has one surface to which the semiconductor element is disposed. A direction along the one surface is a c-axis direction of the anisotropic graphite. The first bonding layer bonds the semiconductor element to the one surface of the anisotropic graphite. The insulating member has a plate shape, is disposed across the anisotropic graphite from the semiconductor element, and insulates the anisotropic graphite. The metal plate is made of a metal material, has a plate shape, and is disposed between the anisotropic graphite and the insulating member. The second bonding layer bonds the anisotropic graphite and the metal plate. The third bonding layer bonds the metal plate and the insulating member.

In the semiconductor device described above, the metal plate is disposed between the anisotropic graphite and the insulating member. Thus, heat can be transferred toward an outer edge of the anisotropic graphite via the metal plate. Therefore, it is possible to lower the thermal resistance of the semiconductor device.

Embodiments of the present disclosure will be described below with reference to the drawings. In the following embodiments including other embodiments to be described below, the same or equivalent components will be described with the same reference numerals.

First Embodiment

A first embodiment of the present disclosure will be described with reference to FIGS. 1 to 6. Note that an X-axis, a Y-axis, and a Z-axis are shown in the drawings attached to the present specification. One direction will be described as the X-axis, one direction perpendicular to the X-axis will be described as the Y-axis, and a direction perpendicular to the X-axis and the Y-axis will be described as the Z-axis.

Figure 2:
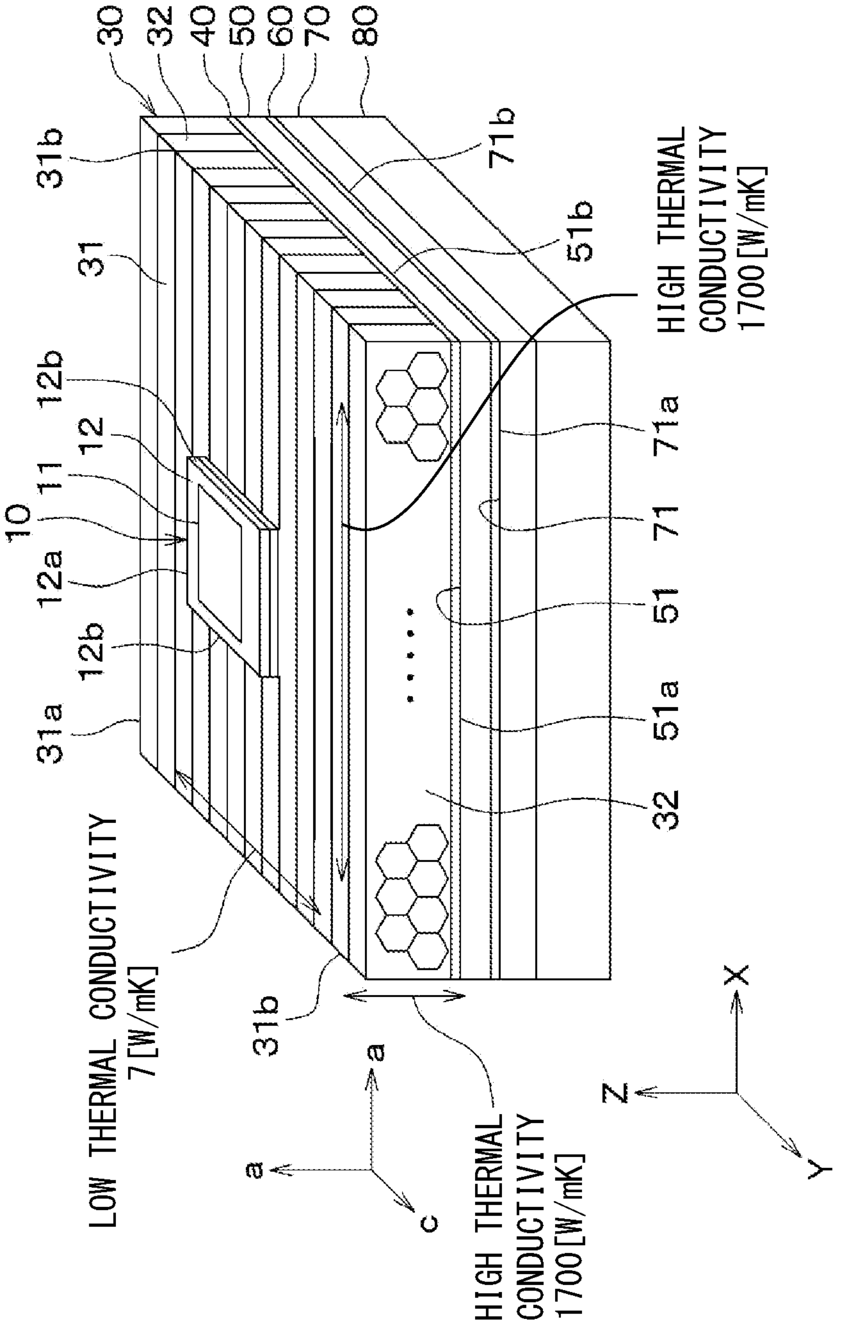
FIG. 2 is a perspective view of the semiconductor device shown in FIG. 1.

As shown in FIGS. 1 and 2, a semiconductor device of the present embodiment includes a semiconductor element 10, a first bonding layer 20, an anisotropic graphite 30, a second bonding layer 40, a metal plate 50, a third bonding layer 60, and a ceramic substrate 70. The semiconductor element 10 is cooled by joining the ceramic substrate 70 to a cooler 80.

The semiconductor element 10 is a semiconductor chip, and has, for example, a power element built therein. Examples of the power element include an insulated gate bipolar transistor (IGBT) and a metal-oxide-semiconductor field-effect transistor (MOSFET). In this example, the semiconductor element 10 is a semiconductor chip in which a vertical IGBT is built. As shown in FIG. 2, the semiconductor element 10 has an upper surface electrode 11. The upper surface electrode 11 is an electrode connected to an emitter or the like in the vertical IGBT, and is arranged on a surface 12 of the semiconductor element 10. Although not shown, a control electrode (not shown) connected to a gate of the vertical IGBT and the like is disposed at a position on the surface 12 that is different from a position where the upper surface electrode 11 is disposed. The upper surface electrode 11 and the control electrode can be electrically connected to an external device by being connected to bonding wires or conductive parts. Although not shown, a lower surface electrode (not shown) is disposed on the other surface of the semiconductor element 10 opposite to the surface 12. The lower surface electrode is an electrode connected to a collector or the like in the vertical IGBT, and is connected to the anisotropic graphite 30 via the first bonding layer 20. The first bonding layer 20 is made of a conductive material as will be described later, and the anisotropic graphite 30 is a conductor. Therefore, by connecting a conductor component to the anisotropic graphite 30 for external extraction, the lower surface electrode can also be electrically connected to an external device.

The semiconductor element 10 has a plate shape having a rectangular shape in a top view. Opposing two sides 12*a* of the surface 12 extend along the X-axis, the other two opposing sides 12*b* of the surface 12 extend along the Y-axis, and a thickness direction of the semiconductor element 10 is along the Z-axis. In the present specification, "along" the X-axis, the Y-axis, and the like is preferably parallel, but does not necessarily mean parallel, and also includes being inclined with respect to the axis.

The first bonding layer 20 is made of a conductive bonding material such as solder, silver paste, or silver sheet. The first bonding layer 20 may have any thickness. For example, the first bonding layer 20 has a thickness of 0.02 mm to 0.05 mm. The semiconductor element 10 is electrically and physically bonded to the anisotropic graphite 30 by the first bonding layer 20.

The anisotropic graphite 30 is graphite having anisotropy in thermal conduction and functions as a heat spreader. The anisotropic graphite 30 may have any thickness. For example, the anisotropic graphite 30 has a thickness of 2.0 mm.

As shown in FIG. 2, the anisotropic graphite 30 has a graphite crystal structure in which graphite layers of hexagonal plate crystals overlap, and a direction in which the graphite layers overlap is the c-axis and a plane direction of the graphite layers with the c-axis as the normal direction is the a-axis. The anisotropic graphite 30 has a plate shape having a rectangular shape in a top view. Opposing two sides 31*a* of a surface 31 of the anisotropic graphite 30 extend along the X-axis, the other two opposing sides 31*b* of the surface 31 extend along the Y-axis, and a thickness direction of the anisotropic graphite 30 is along the Z-axis. That is, in the anisotropic graphite 30, the a-axis is arranged along the X-axis and the Z-axis, and the c-axis is arranged along the Y-axis. The size of the anisotropic graphite 30 is set such that two sides 31*a* are larger than two sides 12*a* of the semiconductor element 10 in the X-axis direction, and two sides 31*b* are larger than two sides 12*b* of the semiconductor element 10 in the Y-axis direction. The semiconductor element 10 is bonded to the anisotropic graphite 30 at a substantially central position on one surface 31 of the anisotropic graphite 30 via the first bonding layer 20.

The anisotropic graphite 30 has a high thermal conductivity of about 1700 W/mK in the a-axis direction, that is, the X-axis direction and the Z-axis direction, but has a low thermal conductivity of about 7 W/mK in the c-axis direction, that is, the Y-axis direction. Therefore, when the semiconductor element 10 generates heat, the heat is easily transferred in the anisotropic graphite 30 in the direction along the a-axis due to the high thermal conductivity, but the heat is difficult to be transferred along the c-axis due to the low thermal conductivity.

The second bonding layer 40 and the third bonding layer 60 are provided to bond the metal plate 50 to the anisotropic graphite 30 and the ceramic substrate 70. Although the second bonding layer 40 and the third bonding layer 60 may be made of different materials, in the present example, the second bonding layer 40 and the third bonding layer 60 are made of the same conductive material, such as silver paste or silver solder, which has a high thermal conductivity. The second bonding layer 40 and the third bonding layer 60 may have any thickness. For example, both the second bonding layer 40 and the third bonding layer 60 has a thickness within a range from 0.02 mm to 0.05 mm. The second bonding layer 40 physically connects the anisotropic graphite 30 and the metal plate 50, and the third bonding layer 60 physically connects the metal plate 50 and the ceramic substrate 70. In the present embodiment, since the second bonding layer 40 is made of the conductive material, the anisotropic graphite 30 and the metal plate 50 are also electrically bonded by the second bonding layer 40.

The metal plate 50 corresponds to a first metal plate. The metal plate 50 has a plate shape, and is made of a metal material having higher thermal conductivity than the ceramic substrate 70 and at least the c-axis direction of the anisotropic graphite 30. The metal plate 50 is sandwiched between the anisotropic graphite 30 and the ceramic substrate 70 and bonded therebetween via the second bonding layer 40 and the third bonding layer 60. The metal plate 50 has a rectangular shape in a top view. Opposing two sides 51*a* of a surface 51 of the metal plate 50 extend along the X-axis, the other two opposing sides 51*b* of the surface 51 extend along the Y-axis, and a thickness direction of the metal plate 50 is along the Z-axis. The size of the metal plate 50 is the same as or larger than the anisotropic graphite 30, that is, the dimensions of the two sides 51*a* are the same as or larger than the two sides 31*a* of the anisotropic graphite 30, and the dimensions of the other two sides 51*b* are also the same as or larger than the two sides 31*b* of the anisotropic graphite 30. When viewed from the Z-axis direction, the anisotropic graphite 30 is arranged so as not to protrude from the metal plate 50. However, due to manufacturing errors, it is also acceptable that the two sides 51*a* of the metal plate 50 may be slightly smaller than the two sides 31*a* of the anisotropic graphite 30, or the two sides 51*b* of the metal plate 50 may be slightly smaller than the two sides 31*b* of the anisotropic graphite 30.

The metal material of the metal plate 50 includes, for example, gold, silver, copper, aluminum, molybdenum, or tungsten. The thickness of the metal plate 50 is preferably within a range from 0.2 mm to 3.0 mm, more preferably within a range from 1.0 mm to 2.0 mm, and much more preferably 1.5±0.1 mm. In the present disclosure, the range from 0.2 mm to 3.0 mm means a range that is 0.2 mm or more and 3.0 mm or less, and the range from 1.0 mm to 2.0 mm means a range that is 1.0 mm or more and 2.0 mm or less.

The ceramic substrate 70 is an insulating member disposed across the anisotropic graphite 30 from the semiconductor element 10. In other words, the anisotropic graphite 30 is disposed between the ceramic substrate 70 and the semiconductor element 10. The ceramic substrate 70 is made of an insulating plate-shaped member with high thermal conductivity, and is made of aluminum nitride or alumina, for example. The ceramic substrate 70 transfers heat generated by the semiconductor element 10 to the cooler 80 via the anisotropic graphite 30 and the metal plate 50 while insulating the metal plate 50, the anisotropic graphite 30, the semiconductor element 10, and the like from the cooler 80. The ceramic substrate 70 has a rectangular shape in a top view. Opposing two sides 71*a* of a surface 71 of the ceramic substrate 70 extend along the X-axis, the other two opposing sides 71*b* of the surface 71 extend along the Y-axis, and a thickness direction of the ceramic substrate 70 is along the Z-axis. The size of the ceramic substrate 70 is the same as or larger than the metal plate 50, that is, the dimensions of the two sides 71*a* are the same as or larger than the two sides 51*a* of the metal plate 50, and the dimensions of the other two sides 71*b* are also the same as or larger than the two sides 51*b* of the metal plate 50. The ceramic substrate 70 may have any thickness as long as the ceramic substrate 70 can restrict the creeping discharge. For example, the thickness of the ceramic substrate 70 is 0.32 mm.

The cooler 80 dissipates heat by exchanging heat with cooling water, air, or the like. The cooler 80 is made of, for example, a metal member. The cooler 80 may have any shape, and may include radiation fins or the like. The ceramic substrate 70 is attached to a surface of the cooler 80.

The semiconductor device according to the present embodiment is configured by the structure described above. Next, the operation and effects of the semiconductor device according to the present embodiment will be described.

As described above, in the semiconductor device according to the present embodiment, the metal plate 50 made of the metal plate-shaped member is disposed between the anisotropic graphite 30 and the ceramic substrate 70. Since the metal plate 50 made of the metal plate-shaped member, it becomes easier to transfer heat in the Y-axis direction of the anisotropic graphite 30, and it becomes easier to dissipate the heat generated by the semiconductor element 10. This makes it possible to reduce the thermal resistance of the semiconductor device. Hereinafter, the reason why such effects can be obtained will be explained based on simulation.

Figure 3:
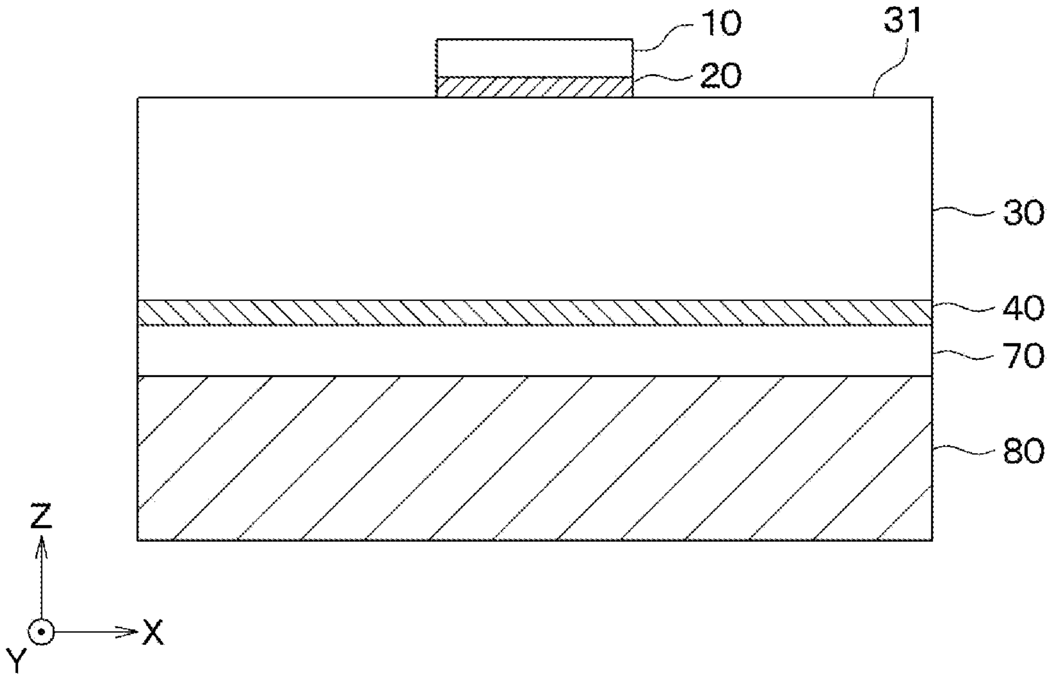
FIG. 3 is a cross-sectional view of a semiconductor device shown as a reference structure.
Figure 4:
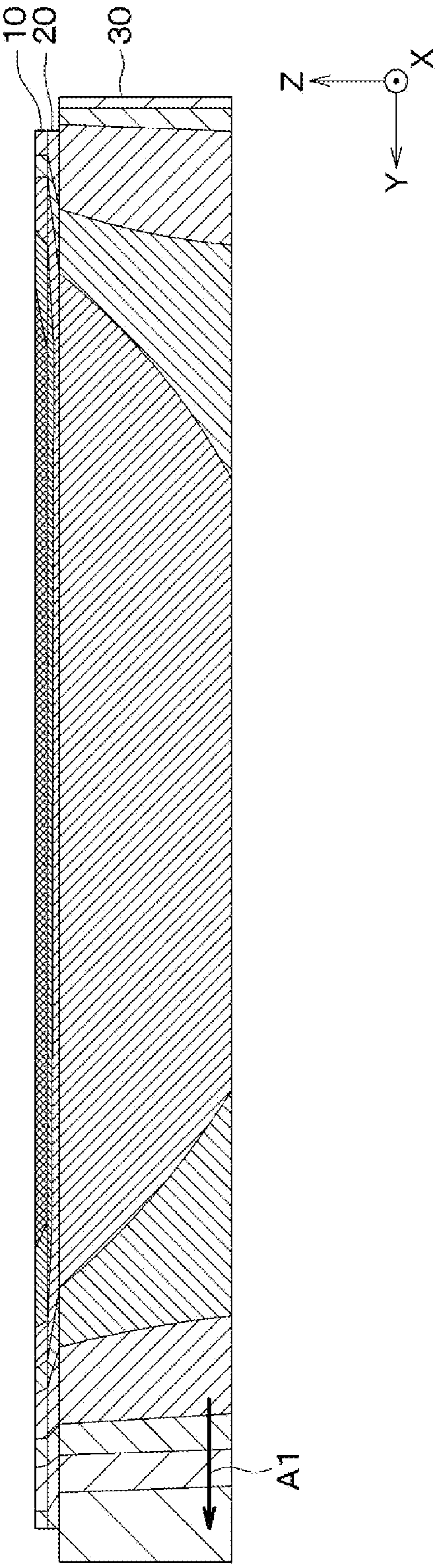
FIG. 4 is a diagram showing a simulation result of heat transfer in the semiconductor device having the reference structure shown in FIG. 3.
Figure 5:
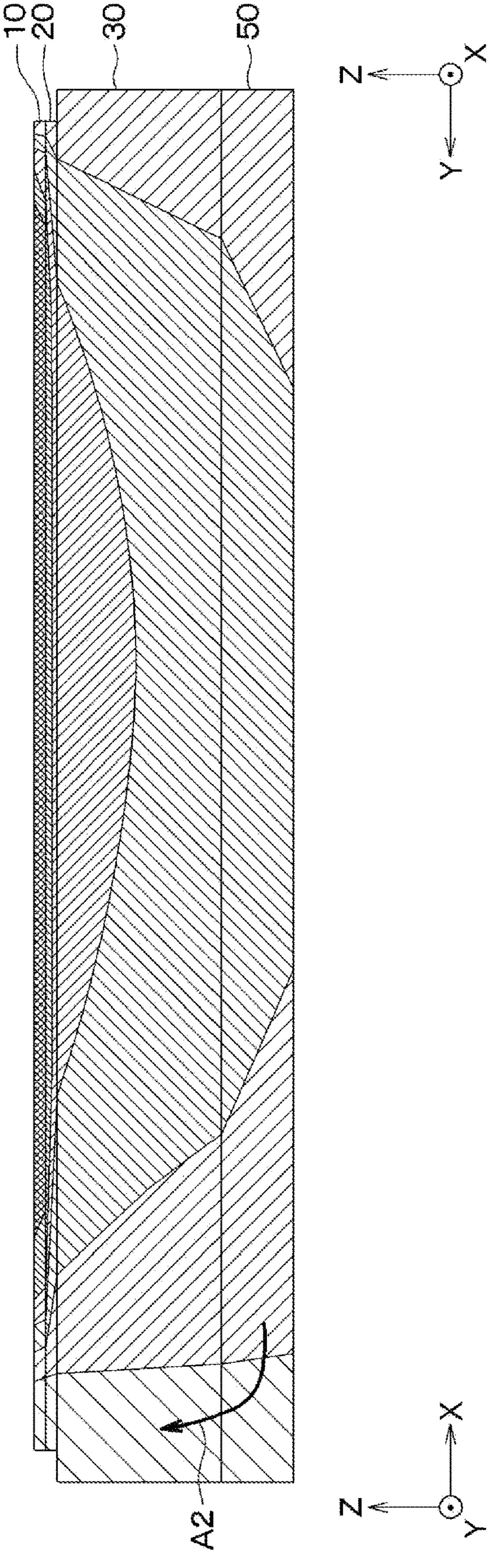
FIG. 5 is a diagram showing a simulation results of heat transfer in the semiconductor device of the first embodiment shown in FIG. 1.

FIG. 3 shows a reference structure in which the anisotropic graphite 30 and the ceramic substrate 70 are bonded by a thin second bonding layer 40 without the metal plate 50. A simulation of heat transfer is performed on the reference structure. Similar simulation of heat transfer was also performed on the semiconductor device having the structure of the present embodiment shown in FIG. 1. FIG. 4 and FIG. 5 show the simulation results of the reference structure shown in FIG. 3 and the semiconductor device of the present embodiment shown in FIG. 1, respectively. Note that FIG. 4 and FIG. 5 show the results of heat conduction analysis by computer aided engineering (CAE) in a cross section along the Y-axis direction, and the wider the hatching interval, the lower the temperature.

As shown in FIG. 4, it can be seen that in the reference structure, the temperature is low at both ends of the anisotropic graphite 30 in the Y-axis direction. This indicates that the heat generated by the semiconductor element 10 is not sufficiently transferred in the Y-axis direction. In this way, in the reference structure, the effect of transferring heat in the Y-axis direction within the anisotropic graphite 30 is low, and the heat generated by the semiconductor element 10 cannot be released. Therefore, it is difficult to lower the thermal resistance of the semiconductor device.

On the other hand, in the semiconductor device of the present embodiment, it can be seen that the temperature at both ends of the anisotropic graphite 30 in the Y-axis direction is higher than that of the reference structure. This indicates that the heat generated by the semiconductor element 10 is sufficiently transferred in the Y-axis direction. In this way, in the semiconductor device of the present embodiment, the effect of transferring heat in the Y-axis direction in the anisotropic graphite 30 is high, and the heat generated by the semiconductor element 10 can be released. Therefore, it is possible to lower the thermal resistance of the semiconductor device.

It can be considered that the above-described difference is caused by whether or not the metal plate 50 is interposed between the anisotropic graphite 30 and the ceramic substrate 70. In the reference structure, since there is only the thin second bonding layer 40, it is difficult for heat transfer through the second bonding layer 40, and the heat transferred from the semiconductor element 10 is not sufficiently transferred in the direction of arrow A1 in FIG. 4, that is, in the Y-axis direction of the anisotropic graphite 30. As a result, the heat is not transferred to a wide range in the anisotropic graphite 30, and the range where the heat is transferred to the ceramic substrate 70 is also narrowed. Therefore, the thermal resistance of the semiconductor device cannot be lowered.

On the other hand, when the metal plate 50 is interposed as in the semiconductor device of the present embodiment, the heat transferred from the semiconductor element 10 to the anisotropic graphite 30 passes through the metal plate 50, as indicated by arrow A2 in FIG. 5, and the heat is also transferred in the Y-axis direction in the anisotropic graphite 30. Therefore, a state similar to that in which the heat is transferred from the semiconductor element 10 to a wide range in the anisotropic graphite 30 is created. As a result, the heat is transferred to a wider range of the ceramic substrate 70, and cooling can be performed over a wider area. Therefore, it is possible to lower the thermal resistance of the semiconductor device.

As described above, the thermal resistance can be lowered by providing the metal plate 50 as in the semiconductor device of the present embodiment. The present inventors also examined a preferable thickness of the metal plate 50.

Figure 6:
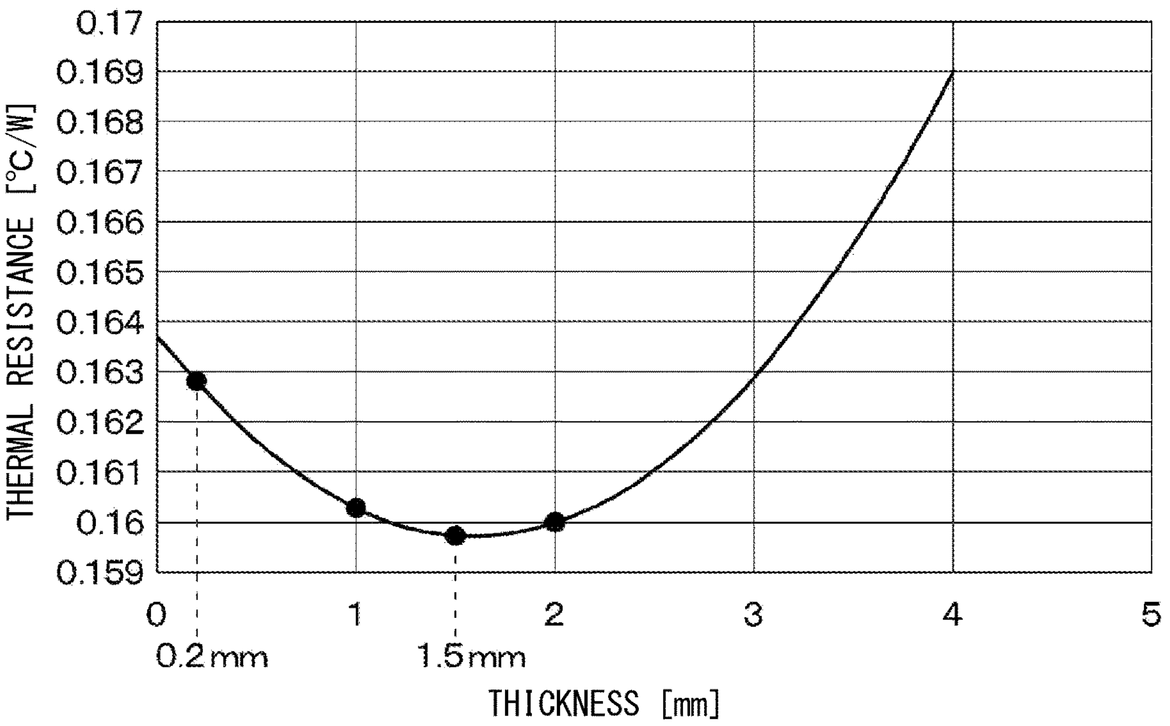
FIG. 6 is a diagram showing the relationship between a thickness of a metal plate and a thermal resistance of the semiconductor device.

As a result, it was found that the thickness of the metal plate 50 and the thermal resistance of the semiconductor device have a relationship as shown in FIG. 6.

Specifically, as shown in FIG. 6, when the metal plate 50 was provided, the thermal resistance gradually decreased compared to a case where the metal plate 50 had a thickness of 0, that is, the metal plate 50 was not provided. In particular, when the thickness of the metal plate 50 was in a range from 0.2 mm to 3.0 mm, the thermal resistance decreased significantly, and when the thickness was within a range from 1.0 mm to 2.0 mm, the thermal resistance decreased more. The thermal resistance was lowest when the thickness of the metal plate 50 was 1.5 mm. Note that the thermal resistance was lowest when the thickness of the metal plate 50 was 1.5 mm, but within a range of ±0.1 mm from 1.5 mm, the thermal resistance was equivalent to that when the thickness was 1.5 mm. Note that if the metal plate 50 is too thick, the distance from the anisotropic graphite 30 to the cooler 80 becomes large and the cooling effect is restricted. Therefore, it is preferable to set the thickness to be 3.0 mm or less.

Although the relationship between the thickness of the metal plate 50 and the thermal resistance varies slightly depending on the material of the metal plate 50 and the structure of the semiconductor device, the relationship is basically the same.

Therefore, in the semiconductor device of the present embodiment, the thickness of the metal plate 50 is preferably within the range from 0.2 mm to 3.0 mm, more preferably within the range from 1.0 mm to 2.0 mm, and much more preferably 1.5±0.1 mm.

As explained above, in the semiconductor device of the present embodiment, the metal plate 50 is provided between the anisotropic graphite 30 and the ceramic substrate 70. Accordingly, the heat can be transferred to the outer edge of the anisotropic graphite 30 via the metal plate 50. Specifically, it becomes possible to enhance the effect of transferring the heat in the Y-axis direction in the anisotropic graphite 30. Therefore, it is possible to lower the thermal resistance of the semiconductor device.

Specifically, when the thickness of the metal plate 50 is set to be within the range from 0.2 mm to 3.0 mm, preferably within the range from 1.0 mm to 2.0 mm, it is possible to reduce the thermal resistance of the semiconductor device. Especially when the thickness of the metal plate 50 is set to 1.5±0.1 mm, the thermal resistance of the semiconductor device can be further reduced.

Second Embodiment

The following describes a second embodiment. The present embodiment is different from the first embodiment in that a configuration between the semiconductor element 10 and the anisotropic graphite 30 is changed, and the remaining configurations are the same as those in the first embodiment. Therefore, only the different configuration will be explained.

Figure 7:
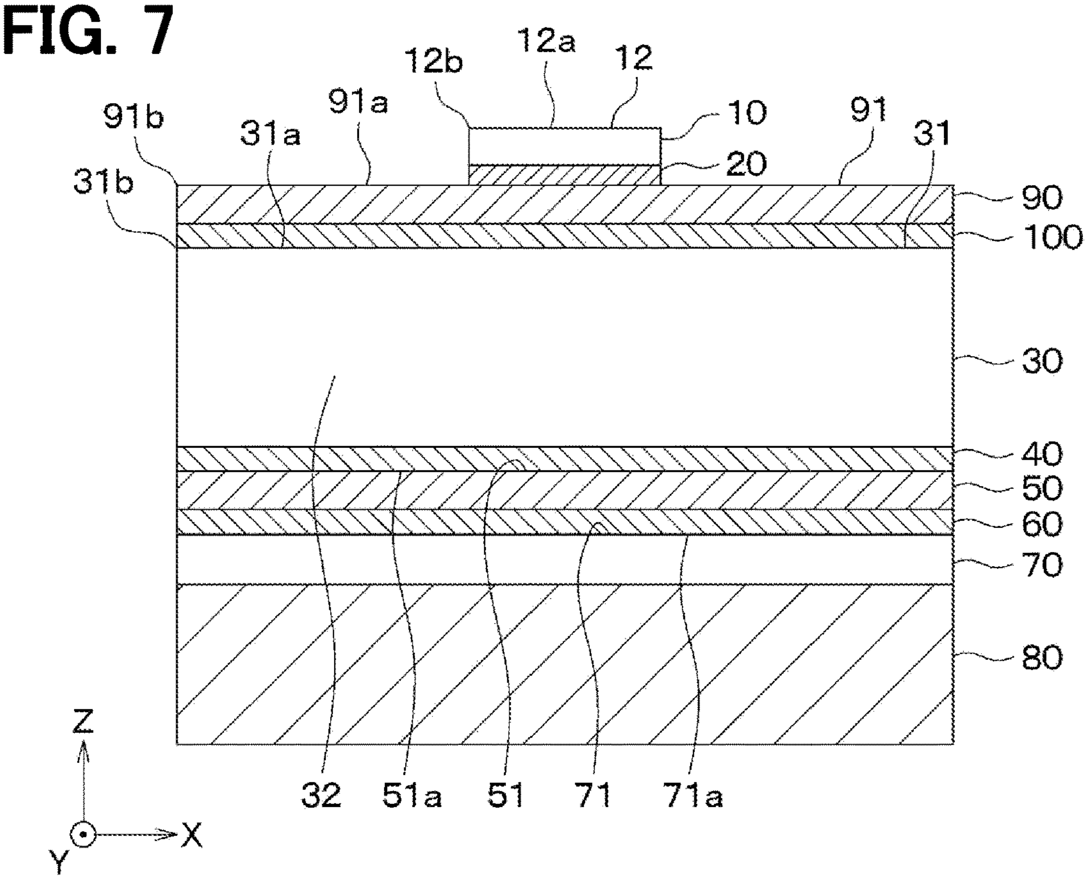
FIG. 7 is a cross-sectional view of a semiconductor device according to a second embodiment.

As shown in FIG. 7, the semiconductor device of the present embodiment includes a metal plate 90, which corresponds to a second metal plate, between the semiconductor element 10 and the anisotropic graphite 30. The materials that can constitute the metal plate 90 are the same as those for the metal plate 50. The metal plate 90 may be made of the same material and may have the same thickness and the same dimensions as the metal plate 50. However, the metal plate 90 may also be made of a different material, and may have a different thickness and different dimensions from the metal plate 50. In the present example, the metal plate 90 is made of the same material and has the same thickness and the same dimensions as the metal plate 50.

Specifically, the metal plate 90 is bonded to the surface 31 of the anisotropic graphite 30 via a fourth bonding layer 100. The metal plate 90 has a rectangular shape in a top view. Opposing two sides 91*a* of a surface 91 of the metal plate 90 extend along the X-axis, the other two opposing sides 91*b* of the surface 51 extend along the Y-axis, and a thickness direction of the metal plate 90 is along the Z-axis. Then, the semiconductor element 10 is bonded to the surface 91 of the metal plate 90 via the first bonding layer 20. The semiconductor element 10 is located approximately at the center of surface 91 of the metal plate 90. Note that the materials that can constitute the fourth bonding layer 100 are the same as those for the second bonding layer 40 and the third bonding layer 60.

In this manner, by disposing the metal plate 90 also between the semiconductor element 10 and the anisotropic graphite 30, the heat can be transferred while spreading in the Y-axis direction also in the metal plate 90. Therefore, in addition to the metal plate 50, the metal plate 90 can also promote heat transfer in the Y-axis direction, and it is possible to further reduce the thermal resistance of the semiconductor device.

Third Embodiment

The following describes a third embodiment. The present embodiment is different from the first and second embodiments in that a configuration around the anisotropic graphite 30 is changed, and the remaining configurations are the same as those in the first and second embodiments. Therefore, only the different configuration will be explained. Although a case where the configuration of the present embodiment is applied to the first embodiment will be described here, the configuration of the present embodiment can also be applied to the second embodiment.

Figure 8:
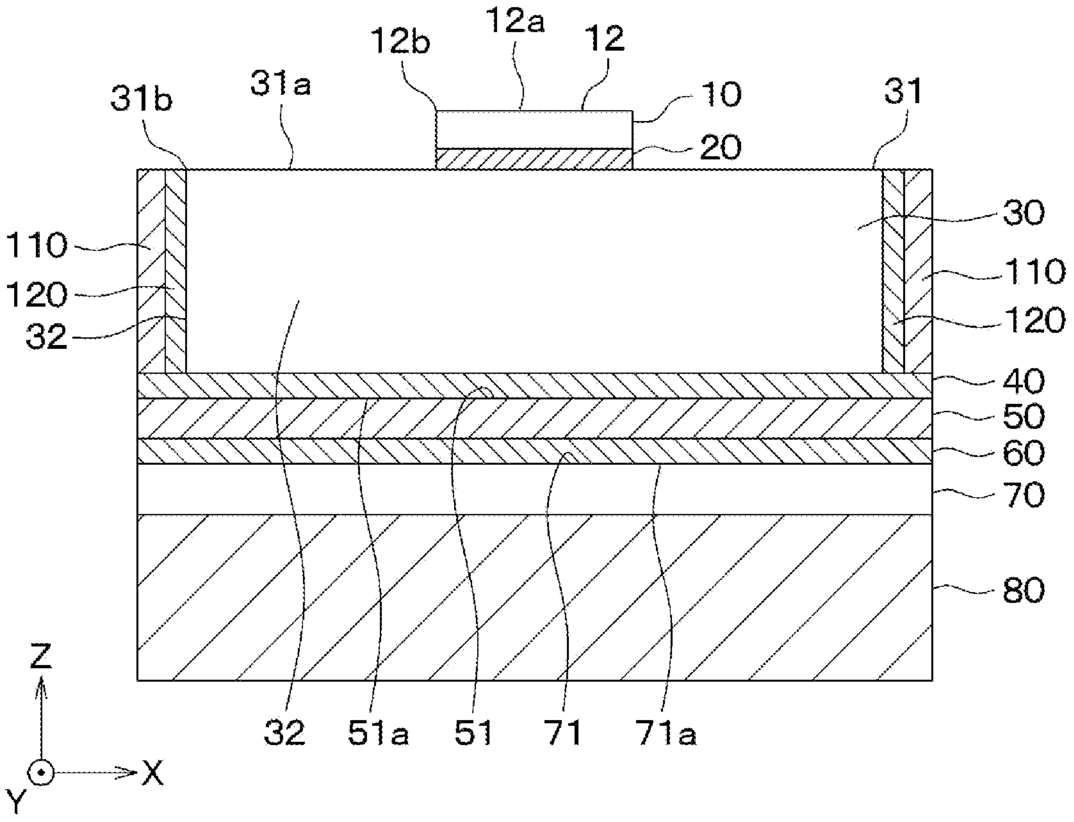
FIG. 8 is a cross-sectional view of a semiconductor device according to a third embodiment.

As shown in FIG. 8, the semiconductor device of the present embodiment includes a metal plate 110. The metal plate 110 covers a periphery of the anisotropic graphite 30, specifically planes along the Z-axis that is the normal direction of the one surface 31, that is, side surfaces 32 of the anisotropic graphite 30. The metal plate 110 corresponds to a covering metal plate. The metal plate 110 is disposed so as to cover at least the side surfaces 32 of the anisotropic graphite 30 that are parallel to the Z-axis and the Y-axis. However, in the present embodiment, the metal plate 110 covers the entire surface of the four side surfaces 32 of the anisotropic graphite 30.

The materials that can constitute the metal plate 90 are the same as those for the metal plate 50. The metal plate 110 may be made of the same material and may have the same thickness and the same dimensions as the metal plate 50, or the metal plate 110 may be made of a different material and may have a different thickness and different dimensions from the metal plate 50. In the present example, the metal plate 90 is made of the same material and has the same thickness and the same dimensions as the metal plate 50. Note that a thickness direction of the metal plate 110 is the normal direction of each of the side surfaces 32 covered by the metal plate 110.

Specifically, the metal plate 110 is bonded to the side surfaces 32 of the anisotropic graphite 30 via a bonding layer 120 corresponding to a side surface bonding layer. The metal plate 110 has a rectangular shape when viewed from a direction along the thickness direction, and each side has a size corresponding to each side of the side surfaces 32 of the anisotropic graphite 30. Note that the materials that can constitute the bonding layer 120 are the same as those for the second bonding layer 40 and the third bonding layer 60.

In this way, when the metal plate 110 is disposed to cover the side surfaces 32 of the anisotropic graphite 30, heat is transferred through the metal plate 110, and heat spreads easily in the Y-axis direction. Therefore, in addition to the metal plate 50, the metal plate 110 can also promote heat transfer in the Y-axis direction, and it is possible to further reduce the thermal resistance of the semiconductor device.

Other Embodiments

While the present disclosure has been described in accordance with the embodiments described above, the present disclosure is not limited to the embodiments and includes various modifications and equivalent modifications. In addition, various combinations and forms, and further, other combinations and forms including only one element, or more or less than these elements are also within the sprit and the scope of the present disclosure.

For example, in each of the above-described embodiments, the ceramic substrate 70 is used as the insulating member, but the insulating member is not limited to the ceramic substrate 70, but may be made of other insulating materials.

In each of the above embodiments, an example has been described in which one semiconductor element 10, one anisotropic graphite 30, one metal plate 50, and one ceramic substrate 70 are regarded as one set of semiconductor device, and the one set of semiconductor device is joined to one cooler 80. However, this is just an example, and a configuration in which two or more sets of semiconductor devices are joined to one cooler 80 may also be adopted.

In each of the above embodiments, an example has been described in which one semiconductor element 10 is disposed for one anisotropic graphite 30, one metal plate 50, and one ceramic substrate 70. However, also in this case, a configuration in which two semiconductor elements 10 are disposed for one anisotropic graphite 30, one metal plate 50, and one ceramic substrate 70 may also be adopted. For example, when the semiconductor elements 10 constitute semiconductor switching elements of an upper arm and a lower arm of an inverter circuit, the semiconductor elements 10 of the upper arm and the lower arm are connected in series. In such a case, one semiconductor element 10 can be connected in series by mounting the other semiconductor element 10 upside down on the surface of the anisotropic graphite 30.

The shapes of the semiconductor element 10, the anisotropic graphite 30, the metal plate 50, and the ceramic substrate 70 in the top view do not necessarily have rectangular shapes. For example, each corner or a part of the corners of the rectangular shapes may be cut out.

What is claimed is:

1. A semiconductor device comprising:
- a semiconductor element having a chip shape;
- an anisotropic graphite having one surface to which the semiconductor element is disposed, a direction along the one surface being a c-axis direction of the anisotropic graphite;
- a first bonding layer bonding the semiconductor element to the one surface of the anisotropic graphite;
- an insulating member having a plate shape, disposed across the anisotropic graphite from the semiconductor element, and insulating the anisotropic graphite;
- a metal plate made of a metal material, having a plate shape, and disposed between the anisotropic graphite and the insulating member;
- a second bonding layer bonding the anisotropic graphite and the metal plate; and
- a third bonding layer bonding the metal plate and the insulating member.

2. The semiconductor device according to claim 1, wherein
- the metal plate has a thickness within a range from 0.2 mm to 3.0 mm.

3. The semiconductor device according to claim 1, wherein
- the metal plate has a thickness within a range from 1.0 mm to 2.0 mm.

4. The semiconductor device according to claim 1, wherein
- the metal plate has a thickness of 1.5±0.1 mm.

5. The semiconductor device according to claim 1, wherein
- the metal material of the metal plate has higher thermal conductivity than the insulating member.

6. The semiconductor device according to claim 1, wherein the metal plate is a first metal plate, the semiconductor device further comprising:
- a second metal plate disposed to the one surface of the anisotropic graphite; and
- a fourth bonding layer bonding the second metal plate and the anisotropic graphite, wherein
- the semiconductor element is bonded to the second metal plate via the first bonding layer.

7. The semiconductor device according to claim 1, further comprising:
- a covering metal plate covering at least a surface of the anisotropic graphite along the c-axis among side surfaces of the anisotropic graphite along a normal direction of the one surface; and
- a side bonding layer bonding the covering metal plate and the anisotropic graphite.

* * * * *